United States Patent [19]

Churchwell et al.

[11] Patent Number: 4,672,739
[45] Date of Patent: Jun. 16, 1987

[54] METHOD FOR USE IN BRAZING AN INTERCONNECT PIN TO A METALLIZATION PATTERN SITUATED ON A BRITTLE DIELECTRIC SUBSTRATE

[75] Inventors: Robert W. Churchwell, Highland; Philip L. Flaitz, Hopewell Junction; James N. Humenik, LaGrangeville, all of N.Y.

[73] Assignee: International Business Machines Corporation, Armonk, N.Y.

[21] Appl. No.: 721,885

[22] Filed: Apr. 11, 1985

[51] Int. Cl.⁴ .............................................. H01L 21/88
[52] U.S. Cl. ........................................ 29/589; 29/590; 29/591; 29/843; 428/622; 357/65
[58] Field of Search ................. 29/589, 590, 591, 832, 29/840, 843, 844, 860; 148/DIG. 69; 357/65; 428/622; 156/89; 228/179

[56] References Cited

U.S. PATENT DOCUMENTS

| | | | |
|---|---|---|---|
| 3,770,529 | 11/1973 | Anderson | 148/DIG. 69 |
| 3,839,727 | 10/1974 | Herdzik et al. | 357/71 |
| 4,060,828 | 11/1977 | Satonaka | 357/65 |
| 4,176,443 | 12/1979 | Iannizzi et al. | 29/589 |
| 4,268,585 | 5/1981 | Daur et al. | 428/622 |
| 4,301,324 | 11/1981 | Kumar et al. | 174/68.5 |
| 4,418,857 | 12/1983 | Ainslie et al. | 228/124 |
| 4,434,434 | 2/1984 | Bhattacharya et al. | 357/71 |
| 4,497,677 | 2/1985 | Sonada et al. | 156/89 |

OTHER PUBLICATIONS

Perry et al, Chemical Engineer's Handbook, McGraw-Hill, New York, 1973, pp. 3–101.
Ainslie et al, "Au/Sn/Ag Braze Alloy", IBM Tech. Discl. Bulletin, 21(8), 1/79, pp. 3117, 3118.
Noth, "Solder Bond", IBM Tech. Discl. Bulletin, 17(8), 1/75, p. 2214.
Schwartz, "Making High Strength Ceramics", IBM Tech. Discl. Bulletin, 11(7) 12/68, p. 848.

Primary Examiner—Brian E. Hearn
Assistant Examiner—T. N. Quach
Attorney, Agent, or Firm—Stanger, Michaelson and Einschlag

[57] ABSTRACT

A method for use in brazing an interconnect pin to a portion of metallization pattern (e.g. a pad) existing on a brittle dielectric substrate, such as a multi-layered ceramic (MLC) substrate, is disclosed. A dielectric layer is formed with appropriate annular openings. Each opening provides a closed containment wall, which extends around and above the pad, to hold the brazing alloy. Each circular containment wall is concentrically aligned with its associated pad and exposes an area, of each pad, having a smaller diameter than that of the entire pad. The containment walls serve to prevent the brazing alloy from coming into contact with any edge of the pads.

10 Claims, 2 Drawing Figures

METHOD FOR USE IN BRAZING AN INTERCONNECT PIN TO A METALLIZATION PATTERN SITUATED ON A BRITTLE DIELECTRIC SUBSTRATE

BACKGROUND OF THE INVENTION

1. Field of the Invention

The invention relates to a method for use in brazing an interconnect pin to a metallization pattern existing on a brittle dielectric substrate, such as a multi-layered ceramic (MLC) substrate.

2. Description of the Prior Art

A multi-chip integrated circuit package employing the well-known "flip-chip" technique utilizes a multi-layer ceramic substrate (MLC)—constructed of a plurality of laminated ceramic layers. All the individual chips are mounted to the top layer of the MLC substrate. A pre-defined metallization pattern lies on each ceramic layer within the substrate. Metallization patterns on certain layers act as voltage reference planes and also provide power to the individual chips. Metallization patterns on other layers route signals between individual chips. Electrical connections to individual terminals of each chip and/or between separate layers are made through well-known vertical interconnects called "vias". Interconnect pins are bonded to metallic pads situated on the face of the MLC substrate and are thereby connected to appropriate metallization patterns existing within the substrate. These interconnect pins route electrical signals between a multi-chip integrated circuit package and external devices.

One well known technique of mounting an interconnect pin to such a metallic pad involves coating the pad and the pin with a protective metallic layer that serves as a diffusion barrier, and thereafter coating the pad and the head of the pin with an appropriate brazing alloy, and then brazing the pin to the pad. Unfortunately, this technique often produces stress between the pad and the underlying ceramic substrate that can lead to fractures in the ceramic situated directly beneath the pad.

This stress originates from two sources: from the interface between the metallic pad and the MLC substrate, and from the brazed joint itself. Specifically, the MLC substrate is rather brittle and has a thermal coefficient of expansion different from that of the pad. Consequently, due to the thermal expansion mismatch at the interface between the pad and the MLC substrate, the ceramic situated directly beneath the pad is placed in considerable stress.

In addition, the brazed joint imparts considerable tensile stress to the pad which is directed through the pad to the underlying MLC substrate. Although the predominant mechanism causing this phenomenon is not completely known, it appears that several factors are at least partially responsible. First, there is a thermal expansion mis-match between the braze and the pad. Second, during brazing, various elemental constituents of the brazing alloy migrate into the pad and form inter-metallic compounds therein which greatly increase the stress occurring within the pad. Third, the braze often becomes embrittled when it reacts with other materials to which the MLC substrate is exposed during its fabrication.

In any event, the tensile stress resulting from the braze additively combines with the stress resulting from the thermal coefficient mis-match, between the pad and the MLC substrate, to produce the total tensile stress exerted on the substrate. A ceramic layer is quite weak in tension. Furthermore, this total stress is greatest around the edges of the pad. Consequently, at the edges, the total tensile stress exerted onto the MLC substrate often disadvantageously reaches a level sufficiently high to fracture the ceramic situated directly under the pad. This fracturing can cause the interconnect pin and the pad to mechanically separate from the substrate, thereby ruining the integrated circuit package.

The art has taught that this tensile stress can be reduced by two techniques. First, as disclosed in N. Ainsle et al, "Au/Sn/Ag Braze Alloy", *IBM Technical Disclosure Bulletin*, Vol. 21, No. 8, January 1979, page 3117, and in N. Ainsle et al, "Au/Sn/Ag Braze Alloy", *IBM Technical Disclosure Bulletin*, Vol. 21, No. 8, January 1979, page 3118, the brazing alloy can be changed to one which imparts a relatively low value of stress to a metallic pad. While this appears to be a theoretically simple and ideal solution, it is often extrememly difficult to implement in practice. First, a multi-chip integrated circuit package contains a pre-determined thermal hierarchy, i.e. certain components of the package—such as solder joints between individual chips and the MLC substrate—must melt before other components. This ensures that a chip can be heated to a temperature which will only weaken the solder joint between it and the MLC substrate and enable the chip to be removed from the substrate without damaging other portions of the package. Consequently, the operating temperatures of the chosen brazing alloy must fall within certain prescribed ranges in this hierarchy. Second, both the pad and the interconnect pin are generally fabricated using an underlying alloy having a multilayered metallic coating. Unfortunately, various elemental constituents (particularly tin) of the brazing alloy will often migrate into one or more of the layers comprising the pin and/or the pad and form inter-metallic compounds which greatly increase the tensile stress occurring therein. To prevent this, an appropriate metallic diffusion barrier is applied over both the pin and the pad before applying the brazing alloy. Although such diffusion barriers exist for many brazing alloys, appropriate barriers do not exist for others. Lastly, different brazing alloys become overly ductile or overly elastic when brazed and are thus unsuitable to bond an interconnect pin to a metallic pad. Hence, choosing a different brazing alloy generally requires that the metallurgy of many, if not all, of the interconnects (i.e. the separate metallurgies comprising the socalled interconnect hierarchy) existing within the MLC substrate be completely re-assessed and possibly re-designed. Thus, once the metallurgy of all the interconnects has been determined which of necessity includes selecting an appropriate brazing alloy, substrate manufacturers are quite reluctant to change this alloy.

Second, each metallic pad can be divided into separate non-overlapping wettable segments each surrounded by a non-wettable area. The brazing alloy would only adhere to the wettable areas. This technique produces a bond consisting of many individual brazed joints in which each joint extends over a very small area. Inasmuch as the cross-sectional area of each joint is very small, each of these joints is quite weak. In addition, as the pad is divided into a greater number of increasingly smaller wettable segments, the effective cross-sectional area occupied by all the brazed joints becomes significantly less than that of the pad. Hence, the electrical resistance of the entire bond between the interconnect pin and the pad correspondingly increases. Furthermore, this technique is very difficult and cumbersome to implement in practice. This technique is described, in connection with a solder bond, in R. W. Noth, "Solder Bond", *IBM Technical Disclosure Bulletin*, Vol. 17, No. 8, January 1975, page 2214.

Hence, a need exists in the art for a method, suitable for use in brazing an interconnect pin to a metallic pad, which will lower the tensile stress between the pad and an adjacent dielectric (e.g. MLC) substrate, occurring during a brazing operation, while eliminating any need to change the brazing alloy and simultaneously permitting a strong, reliable, minimally resistive brazed joint to form between the interconnect pin and the pad.

SUMMARY OF THE INVENTION

Accordingly, an object of the present invention is to provide a method for use in brazing an interconnect pin to a portion of a metallization pattern, situated on a brittle dielectric substrate, such as an MLC substrate, which produces a reliable bond between the metallization pattern and the pin.

A particular object is to reduce tensile stress, occurring at the interface between a metallic pad and the bottom surface of an MLC substrate and resulting from brazing, to a value which is less than that required to fracture the substrate.

Another particular object is to eliminate the need to change the brazing alloy.

Another particular object is to provide a strong minimally resistive brazed joint between the pad and the pin.

Another particular object is to increase the mechanical strength of both the MLC substrate and the interface between the pad and the dielectric substrate.

Lastly, another object is to provide a simple method that is easy to implement in a production environment.

These and other objects are achieved in accordance with the teachings of the present invention by limiting the contact of the brazing alloy with the pad such that the brazed joint between the pin and the pad exists primarily in the center of the pad.

In particular, we have discovered that brazing an interconnect pin to a metallic pad causes the tensile stress occurring at the edge of a pad to be greatest whenever the brazed joint is allowed to extend to an edge of the pad.

Consequently, in accordance with the preferred embodiment of the present invention, a braze restricting dielectric layer is applied over the bottom surface of the MLC substrate and all the pads prior to applying the brazing alloy. The braze restricting layer is formed with appropriate annular openings. Each opening covers a closed peripheral portion, generally annularly shaped, of each associated pad. Each opening also provides a closed containment wall, which extends around and above the pad, to hold the brazing alloy. Each circular containment wall is concentrically aligned with its associated pad and exposes an area, of each pad, having a smaller diameter than that of the entire pad. Consequently, when the brazing alloy is applied over the braze restricting layer, this alloy will be restrained by the containment walls from coming into contact with any edge of any of the pads. Thus, the brazed joint for that pad will not extend to the edge of that pad. This advantageously lowers the tensile stress occurring at the interface between the pad and the MLC substrate to a value, at the edge of the pad, below that required to fracture the substrate. Advantageously, the main mechanism for interconnect pin failures then becomes the shank of the pin and not the pin/pad interface.

In accordance with a feature of the invention, the braze restricting layer should advantageously be a compressive layer. Such a layer is comprised of dielectric material having a lower thermal coefficient of expansion than the MLC substrate. Use of a compressive layer, as taught by B. Schwartz "Making High Strength Ceramics", *IBM Technical Disclosure Bulletin*, Vol. 11, No. 7, December 1968, page 848, places the bottom surface of the MLC substrate in a state of compression. Ceramic material is considerably stronger in compression than in tension. Hence, we have found that use of a compressive braze restricting layer partially offsets the tensile stress imparted to the MLC substrate by the braze. Consequently, use of a compressive dielectric braze restricting layer advantageously strengthens the bottom surface of the ceramic substrate and in particular the interface between the pad and the ceramic.

BRIEF DESCRIPTION OF THE DRAWING

The principles of the present invention may be readily understood by considering the following detailed description in conjunction with the drawing, in which.

DETAILED DESCRIPTION

Applicants' inventive method for brazing an interconnect pin to a region of a metallization pattern is applicable in fabricating any apparatus where a dielectric layer serves as the substrate for the metallization pattern and a thermal expansion mismatch exists at the interface between the metallization pattern and the dielectric layer. For example, such a dielectric layer exists as the bottom layer of a MLC substrate used in a "flip-chip" multi-chip package or as the substrate for a metallization pattern (traces and pads) in a printed circuit board. Hence, to simplify the ensuing discussion, any such dielectric layer will be collectively referred to as a dielectric substrate.

Figure 1:
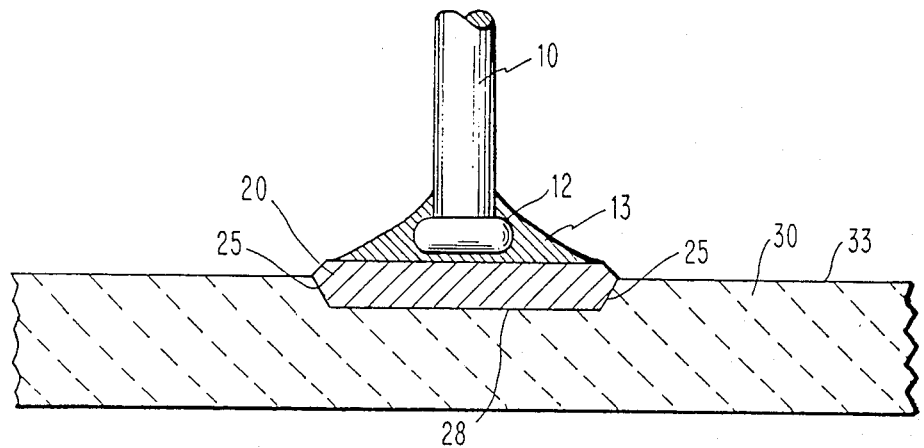
FIG. 1 depicts a cross-sectional view of an interconnect pin bonded to a metallic pad on a dielectric substrate by a technique well known in the art.

FIG. 1 depicts a cross-sectional view of interconnect pin 10 brazed to a region of a metallization pattern (illustratively circularly shaped pad 20) situated on a dielectric substrate by a technique well known in the art. Here, as shown, metallic pad 20 is first conventionally fabricated on surface 33 of dielectric substrate 30. This surface could be the bottom surface of an MLC substrate. Thereafter, the pad is coated with a metallic protective (diffusion barrier) layer (not shown). The material used for this protective layer is determined by the metallurgies of pad 20 and interconnect pin 10, and the brazing alloy. In order to mount the pin to the pad, both pad 20 and head 12 of pin 10 are first completely coated (wetted) with a suitable wellknown brazing alloy, then brought into contact with each other and thereafter brazed. As a result, once brazing has occurred, the brazed joint 13, as shown, extends to edges 25 of pad 20.

Unfortunately, this prior art technique produces considerable tensile stress at the edges of the pad. This stress, in turn, may cause the ceramic located directly beneath the pad, i.e. in the vicinity of interface 28 situated between the pad and the substrate, to fracture. As a result, the interconnect pin and its brazed pad may mechanically separate from the substrate and thereby ruin the integrated circuit package. Specifically, dielectric substrate 30 is rather brittle and has a thermal coefficient of expansion different from that of pad 20. Consequently, a significant thermal expansion coefficient mismatch exists at interface 28 between pad 20 and dielectric substrate 30 which, in turn, places that portion of the dielectric substrate situated directly beneath the pad in stress. This mismatch worsens once the pad is coated with the metallic protective layer and then brazed. As a result, during brazing the substrate is placed in considerable tension. The tensile stress is greatest at edges 25 of pad 20. A ceramic layer is weak in tension. Consequently, the tensile stress occurring at an edge of the pad often reaches a level sufficient to fracture the substrate situated beneath the pad. Disadvantageously, this fracturing may cause both interconnect pin 10 and pad 20, to which this pin is brazed, to separate from the substrate.

We have discovered that the tensile stress occurring at the interface between a metallic pad (e.g. pad 20) and a dielectric substrate (e.g. substrate 30), as a result of brazing a interconnect pin to the pad, is greatest whenever the brazed joint (e.g. brazed joint 13) is allowed to extend to an edge of the pad.

Consequently, in accordance with the principles of the present invention, we limit the contact of the brazing alloy with a pad such that the brazed joint between a pin and the pad exists primarily in the center of the pad and does not extend to any edges of the pad. In particular, we have found that the tensile stress imparted by the brazed joint to a pad, and transmitted therethrough to the underlying dielectric substrate, is greatest at the edge of the braze and increases nearly exponentially with distance away from the center of the braze and towards its edge. Moreover, the stress imparted to the dielectric substrate by the pad itself is greatest at the edges of the pad and also increases nearly exponentially with distance away from the center of the pad and towards its edges. Since these stresses add to form the total stress exerted by the pad onto dielectric substrate 30, the brazing alloy need only be kept a small distance away from all the edges of the pad to provide a substantial reduction in tensile stress occurring along the edges (perimeter) of the pad. This advantageously permits the brazed joint to extend over a significant portion of the pad and thereby form a strong reliable contact having minimal electrical resistance while minimizing any additional tensile stress imparted by the brazed joint to the edge of any pad. As a result of our inventive method, the main mechanism for pin failures advantageously becomes the shank of the interconnect pin. These failures can be easily remedied by merely replacing the pin.

Figure 2:
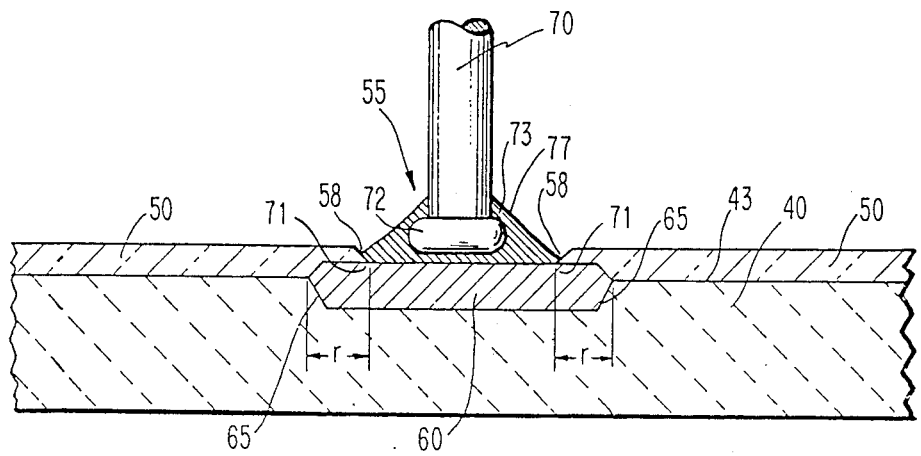
FIG. 2 depicts a cross-sectional view of an interconnect pin bonded to a metallic pad on a dielectric substrate in accordance with the teachings of the present invention.

FIG. 2 depicts a cross-sectional view of interconnect pin 70 bonded to circularly shaped pad 60 on dielectric substrate 40, in accordance with the teachings of the present invention. Here, as shown, metallic pad 60, similar to pad 20 shown in FIG. 1, is bonded to surface 43 of dielectric substrate 40 using any one of many well-known techniques. Braze restricting dielectric layer 50 is situated over both dielectric substrate 40 and all the pads located thereon. As explained in detail later, the braze restricting layer can be applied either coincident with or subsequent to the fabrication of the dielectric substrate. Layer 50 can be any dielectric layer compatible with dielectric substrate 40. However for reasons that will shortly become clear, braze restricting layer 50 should preferably be a compressive layer and, as such, fabricated from a dielectric material having a lower thermal coefficient of expansion than that of the dielectric substrate.

In addition, braze restricting layer 50 has a number of circular openings, each of which is concentrically aligned over a corresponding pad. Inasmuch as all the openings are structurally identical, for purposes of simplicity FIG. 2 only shows one such opening, opening 55, and the following discussion will be limited to specifically discussing opening 55.

In particular, opening 55, has a smaller diameter than that of pad 60. As such, braze restricting layer 50 overlaps a closed annularly shaped peripherally located portion of pad 60 and exposes the remaining centrally located portion of the pad. This annularly shaped overlapped portion comprises circular edge 65 of pad 60 and that peripheral area of the pad contained within an distance "r" measured inward from edge 65. Ideally, if dielectric layer 50 is properly aligned with substrate 40, then the width ("r") of the over-lapped annularly shaped area should be the same all around the pad. However, in practice, the center of opening 55 and the center of pad 60 are likely to be slightly mis-aligned (offset) with respect to each other, and hence some slight deviations in the width of this annular portion are bound to occur around the periphery of opening 55. As long as these deviations are kept small, no adverse results will occur.

Opening 55 has walls 58. These walls—illustratively shown as being inwardly sloping for purposes of illustration but need not be in actuality—completely encircle opening 55 and form a closed containment vehicle extending around and above pad 60. When the brazing alloy is applied within opening 55 of braze restricting layer 50, this alloy is totally confined within the containment vehicle and is thereby prevented from contacting edges 65 of pad 60. Hence, once head 72 of interconnect pin 70 is brazed to pad 60, brazed joint 73 advantageously does not extend to edges 65 of pad 60. As a result, the stress imparted to pad 60 by brazed joint 73 does not reach the edges of the pad, where the stress occurring within the pad reaches a relatively large maximum value. Since the stress occurring within pad 60 decreases nearly exponentially as a function of distance away from the edge of the pad and towards its center, a relatively low stress region within pad 60 begins at a small distance "r" away from edge 65. As such, the total stress, imparted by the additive combination of the stress produced by brazed joint 73 and directed through pad 60 and the stress occurring within pad 60 by virtue of the thermal expansion coefficient mis-match between the pad and dielectric substrate 40, advantageously remains below the value required to fracture dielectric substrate 40. This is particularly true at edges 71 of brazed joint 73 where the stress imparted by the brazed joint reaches a maximum value. In practice, excellent results have been achieved if opening 55 encircles an area that is approximately 80% of the total surface area of pad 60. Clearly, this percentage is not critical; however, to ensure adequate bond strength and minimal electrical contact resistance between interconnect pin 70 and pad 60, this percentage should be kept as high as possible. As such, this percentage will be governed, in part, by the magnitude of any expected clamping forces that will be applied to the interconnect pin.

Moreover, both dielectric substrate 40 and the interface between pad 60 and the substrate can be advantageously strengthened if braze restricting layer 50 is a compressive layer. In particular, if braze restricting layer 50 has a lower thermal coefficient of expansion than the substrate, then this layer is in a state of compression, thereby partially offsetting the tensile stress imparted to the substrate by the pad itself and the brazed joint. A suitable compressive layer can be fabricated by slightly altering the composition of the materials used for fabricating dielectric substrate 40 to yield a dielectric material having a lower coefficient of thermal expansion than the substrate.

The arrangement shown in FIG. 2 can be manufactured using any one of three methods: co-fired pad and co-fired braze restricting layer, co-fired pad and post-fired braze restricting layer, and post-fired pad and post-fired braze restricting layer.

a. Co-fired Pad and Co-fired Braze Restricting Layer

Here, pad 60 can be any metallic pad suitable for a desired dielectric substrate and can be fabricated using a suitable metallic paste which contains appropriate well-known adhesives or other metals which will co-sinter with the substrate.

Braze restricting layer 50 is implemented using a "green sheet" made of the same dielectric material as that of the dielectric substrate or preferably, for a compressive effect, a dielectric material having a lower thermal expansion coefficient than the material comprising the dielectric substrate. All the openings, e.g. opening 55, in braze restricting layer 50 are formed by appropriately punching out the green sheet. Once all these openings are formed, then they are all filled with a fugitive paste prior to laminating this dielectric layer with other "green sheet" layers comprising dielectric substrate 40 (in the case of an MLC substrate). Thereafter, the laminated structure is sintered. The fugitive paste maintains the annular shape of each opening during lamination and subsequent burnout of the MLC substrate during sintering.

b. Co-fired Pad and Post-fired Braze Restricting Layer

The pad is essentially the same as that described above in connection with the co-fired pad and co-fired braze restricting layer. However, here, the entire surface of the dielectric substrate, including the pads, is coated with dielectric material, which forms the braze restricting layer, after the dielectric substrate has been fired (sintered). This dielectric material is then selectively etched away or patterned to produce the openings.

Specifically, braze restricting layer 50 can be manufactured using any one of several techniques. First, this layer can be sputtered quartz or a glass layer that has been previously deposited, over surface 43 of dielectric substrate 40, by chemical vapor deposition and thereafter etched back from the center of the pads to form all the openings. The braze restricting layer could also be deposited from a re-flowed slurry and then appropriately etched to form all the openings. Alternatively, the openings could be formed, in the re-flowed layer, through patterning. Specifically, a suitable barrier would be placed over the pad, the pad would then be reflowed and thereafter the barrier would be removed. If the viscosity of the molten braze restricting layer was sufficiently high, then the barrier would not be needed. Additionally, to increase the strength of the pad and lower its composite thermal expansion coefficient, a metal, such as molybdenum or kovar, having a low coefficient of thermal expansion could also be post-fired onto the pad.

c. Post-fired Pad and Post-fired Braze Restricting Layer

To apply post-fired pads to the dielectric (MLC) substrate, a number of "green sheet" elements are first laminated together and then fired to form the dielectric substrate. Thereafter, the pads are applied to the substrate using any thin film technique (such as ion plating, magnetron sputtering and the like) which provides high adhesion and low stress between the pad and the dielectric substrate. Inasmuch as the metal used in the pads does not need to co-sinter with the ceramic in the dielectric substrate, the pad can be fabricated out of a variety of alloys such as Ti/Cu/Ni, Ti/Cu/Mo/Ni, Cr/Cu/Ni, Cr/Cu/Mo/Ni and many other metallic combinations. The post-fired braze restricting layer is then fabricated using any of the techniques described above in connection with the co-fired pad and post-fired braze restricting layer.

Although a preferred embodiment has been shown and described above, many other embodiments containing the teachings of the present invention can be readily devised by those skilled in the art.

We claim:

1. In a method for brazing interconnect pins to metallic pads, each pad situated within a pattern of conductive metallurgy formed on a surface of a dielectric substrate, the improvement comprising the steps of:

forming a dielectric layer on the surface of said substrate, said dielectric layer having a lower coefficient of thermal expansion than that of said substrate and comprising a plurality of openings, wherein each of said openings is concentrically aligned with a corresponding pad and is smaller than the corresponding pad so as to overlap a closed peripheral portion thereof and thereby define a closed wall to contain brazing material such that brazing material is prevented from contacting an edge of the corresponding pad in order to reduce the stress occurring at an interface between the pad and the substrate;

seating a head of an interconnect pin in a corresponding one of said openings; and bonding the head of said pin to said pad by the brazing material contained within said closed wall.

2. The method of claim 1 wherein the forming step includes the step of aligning the dielectric layer with the dielectric substrate such that the dielectric layer overlaps a peripheral annularly shaped portion of said corresponding pad and exposes a central portion of said corresponding pad.

3. The method of claim 2 wherein the forming step comprises the steps of:

forming a multi-layered laminated structure comprising at least a first green sheet element to form said dielectric substrate, a layer of conductive paste defining said pattern of conductive metallurgy, and a second green sheet element impregnated with said dielectric material to form said dielectric layer; and sintering said laminated structure.

4. The method of claim 3 wherein the forming step includes the steps of:

removing material from said second green sheet to form said plurality of openings, and filling said openings with a fugitive paste prior to laminating said second green sheet to another layer and sintering said laminated structure.

5. The method of claim 2 further including the steps of:

forming a multi-layered laminated structure comprising at least a first green sheet element to form said dielectric substrate and a layer of conductive paste to define said pattern of conductive metallurgy;

sintering said laminated structure;

depositing the dielectric material over a surface of said laminated structure to define said dielectric layer; and removing selected portions of said dielectric layer, subsequent to sintering, in order to define said plurality of openings.

6. The method of claim 5 wherein said selected portions are removed either through patterning or etching.

7. The method of claim 6 wherein said forming step further includes the step of post-firing a protective metallic layer onto said pad prior to brazing said pin to said pad.

8. The method of claim 7 wherein said forming step further includes the step of post-firing a metallic layer onto said pad wherein said metallic layer has a lower thermal coefficient of expansion than that of said pad.

9. The method of claim 2 wherein the forming step comprises the steps of:

firing at least a first green sheet element to form said dielectric substrate, applying said pattern of conductive metallurgy over said first fired green sheet element, depositing the dielectric material over said pattern and said first fired green sheet element to define said dielectric layer; and removing selected portions of said dielectric layer, in order to define said plurality of openings.

10. The method of claim 9 wherein said selected portions are removed either through patterning or etching.

* * * * *